(12) United States Patent
Roo

(10) Patent No.: US 6,900,686 B1
(45) Date of Patent: May 31, 2005

(54) ANALOG SWITCHING CIRCUIT

(75) Inventor: Pierte Roo, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 68 days.

(21) Appl. No.: 10/455,668

(22) Filed: Jun. 5, 2003

(51) Int. Cl.[7] .............................................. H03K 17/62
(52) U.S. Cl. ...................... 327/403; 327/407; 327/563; 327/65
(58) Field of Search ................ 327/403–405, 327/407, 408, 411, 99, 427, 581, 63–65, 67, 560–563; 330/252, 253, 258–260

(56) References Cited

U.S. PATENT DOCUMENTS

| | | | | |
|---|---|---|---|---|
| 4,191,900 A | * | 3/1980 | Redfern et al. | 327/63 |
| 4,547,683 A | * | 10/1985 | Bingham | 327/63 |
| 5,936,469 A | * | 8/1999 | Alexander et al. | 330/258 |
| 2003/0080800 A1 | * | 5/2003 | Kuttner | 327/408 |

OTHER PUBLICATIONS

U.S. Appl. No. 10/106,720; filed Mar. 26, 2002 entitled "Method and Apparatus for Automatic Crossover and Parallel Detect".

U.S. Appl. No. 10/358,709; filed Feb. 5, 2003 entitled "Self–Reparable Semiconductor and Method Thereof".

* cited by examiner

*Primary Examiner*—Long Nguyen

(57) ABSTRACT

An analog switching circuit selects one of a first pair of differential outputs of a first circuit having a first common mode voltage and a second pair of differential outputs of a second circuit having a second common mode voltage. The analog switching circuit includes first and second switches having one of a source and drain that communicate with the first pair of differential outputs. Third and fourth switches have one of a source and drain that communicate with the second pair of differential outputs. An operational amplifier has a first input that communicates with the other of the source and drain of the first and third switches and a second input that communicates with the other of the source and drain of the second and fourth switches. A common mode feedback circuit communicates with the first and second inputs of the operational amplifier and maintains a common mode voltage input of the amplifier below the first and second common mode voltages.

58 Claims, 8 Drawing Sheets

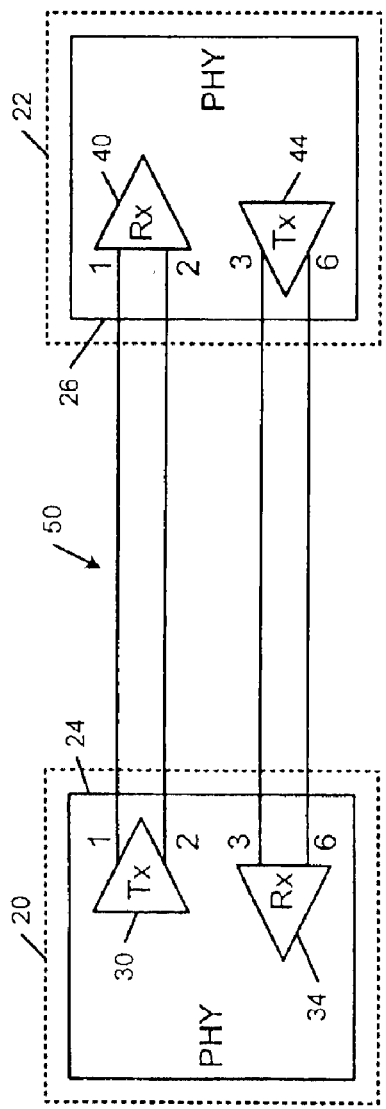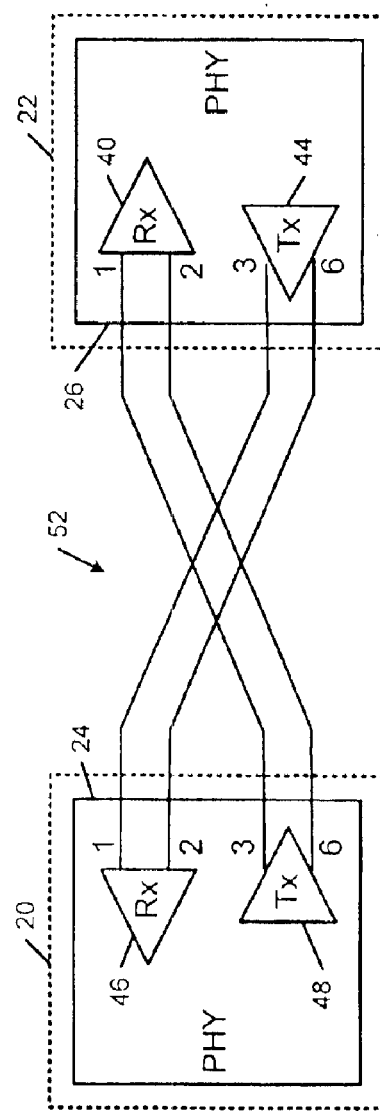
FIG. 2A
*Prior Art*
FIG. 2B
*Prior Art*

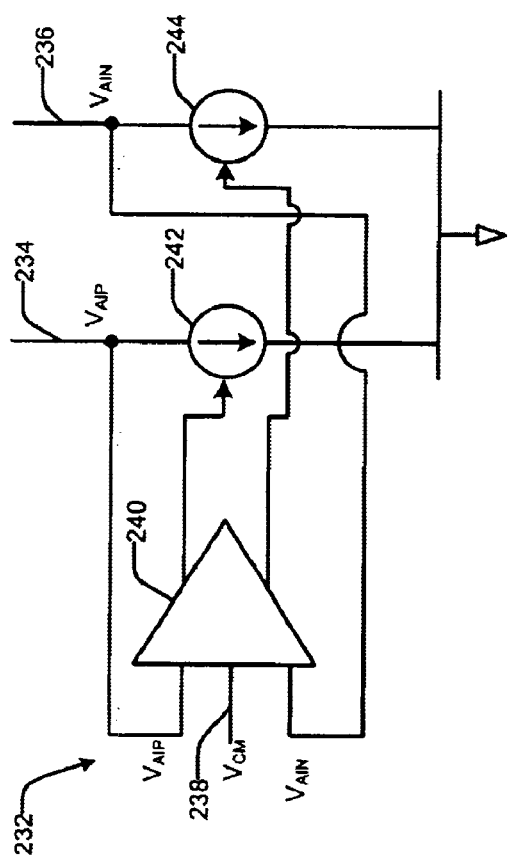
FIG. 7
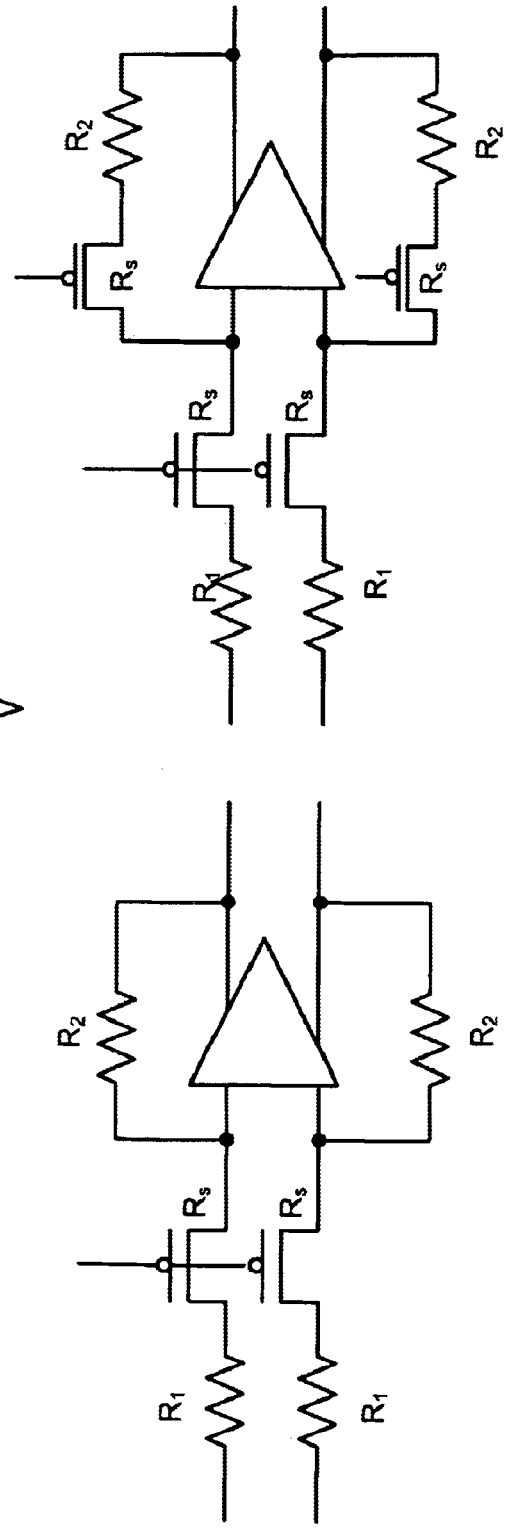
FIG. 11
FIG. 10

ANALOG SWITCHING CIRCUIT

FIELD OF THE INVENTION

The present invention relates to analog switching circuits, and more particularly to analog switching circuits for semiconductor devices, network devices, and other integrated circuits.

BACKGROUND OF THE INVENTION

Many circuits selectively receive inputs from and/or provide outputs to two or more other circuits. A switching circuit that includes transistors may be used to select between the inputs and/or outputs. For example in FIGS. 1A and 1B, first and second circuits 10 and 12 are selectively connected by a switching circuit 14 to a third circuit 16. In some implementations, the first and second circuits 10 and 12 are selectively connected by transistors $Q_1$ and $Q_2$ and $Q_3$ and $Q_4$, respectively. Switching inputs $S_1$ and $\overline{S}_1$ are used to select the first circuit 10 or the second circuit 12. When $S_1$ is in a first state, the first circuit 10 is connected and the second circuit 12 is not connected. When $S_1$ is in a second state, the second circuit 12 is connected and the first circuit 10 is not connected.

In some situations, the output signal of the first and second circuits 10 and/or 12 may exceed the voltage supply and/or breakdown voltage of the transistors $Q_1$, $Q_2$, $Q_3$ and $Q_4$ that are used in the switching circuit 14. For example, a voltage supply that supplies the switching circuit 14 may provide 2.5V. The switching circuit 14 may be used to switch between first and second transmitters in an Ethernet network device. The voltage output of an exemplary transmitter in a 100BASET network may be operated with a maximum voltage of 3.5V, a minimum voltage of 1.5V, and a common mode voltage of 2.5V. The maximum voltage level of the transmitter outputs may cause operational problems such as breakdown of the transistors $Q_1$, $Q_2$, $Q_3$, and $Q_4$.

Another situation that may require analog switching includes switching between MDI and MDIX configurations in 100BASET or 10BASET network devices. Referring now to FIGS. 2A and 2B, first and second network devices 20 and 22 include physical layers (PHYs) 24 and 26, respectively, that are connected by network cables. For example, the network device 20 can be a personal computer or printer and the network device 22 can be a network switch. Each of the network devices 20 and 22 is connected by at least two pairs of twisted pair wires that are labeled 1, 2 and 3, 6 in FIGS. 2A and 2B.

When in an MDI configuration in FIG. 2A, the PHY 24 has a first pair 1, 2 that is configured as a transmitter 30 and a second pair 3, 6 that is configured as a receiver 34. When in an MDIX configuration in FIG. 2B, the PHY 24 has first pair 1, 2 that is configured as a receiver 46 and a second pair 3, 6 that is configured as a transmitter 48. When in an MDIX configuration, the PHY 26 has a first pair 1, 2 that is configured as a receiver 40 and a second pair 3, 6 that is configured as a transmitter 44. When the network devices 20 and 22 have different configurations, a standard or straight network cable 50 is used. When the network devices 20 and 22 have the same configuration, a crossover network cable 52 is used. When the incorrect network cable is employed for a particular situation (as in FIG. 2B), either the cable must be changed or the transmitter and receiver connections for one of the network devices needs to be switched.

SUMMARY OF THE INVENTION

An analog switching circuit according to the invention selects one of a first pair of differential outputs of a first circuit having a first common mode voltage and a second pair of differential outputs of a second circuit having a second common mode voltage. The analog switching circuit includes first and second switches having first ends that communicate with the first pair of differential outputs. Third and fourth switches have first ends that communicate with the second pair of differential outputs. An operational amplifier has a first input that communicates with second ends of the first and third switches and a second input that communicates with second ends of the second and fourth switches. A common mode feedback circuit communicates with the first and second inputs of the operational amplifier and maintains a common mode voltage input of the amplifier below the first and second common mode voltages.

In other features, a first pair of resistors are arranged between the first circuit and the first and second switches. A second pair of resistors are arranged between the second circuit and the third and fourth switches.

In still other features, a first resistor has a first end that communicates with the first input of the operational amplifier and a second end that communicates with a first output of the operational amplifier. A second resistor has a first end that communicates with the second input of the operational amplifier and a second end that communicates with a second output of the operational amplifier.

In yet other features, the common mode feedback circuit includes an amplifier that includes a common mode input, a first input that communicates with the first input of the operational amplifier, and a second input that communicates with the second input of the operational amplifier, and first and second outputs. A first current source communicates with the first input of the operational amplifier and the first output of the amplifier. A first current that is output by the first current source is adjusted by the first output of the amplifier. A second current source communicates with the second input of the operational amplifier and the second output of the amplifier. A second current that is output by the second current source is adjusted by the second output of the amplifier.

In still other features, a fifth switch selectively shorts the first pair of differential outputs of the first circuit. A sixth switch selectively shorts the second pair of differential outputs of the second circuit.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein

FIG. 2A is a functional block diagram of a first network device in an MDI configuration and a second network device in a MDIX configuration according to the prior art;

FIG. 2B is a functional block diagram of the first network device in the MDIX configuration and the second network device in the MDIX configuration according to the prior art;

FIG. 7 is an electrical schematic and functional block diagram of a common mode feedback (CMFB) circuit for the switching circuit of FIG. 6;

FIG. 10 is a simplified partial electrical schematic of FIG. 8; and

FIG. 11 is a simplified partial electrical schematic of FIG. 9.

DETAILED DESCRIPTION OF THE PREFERRED EMBODIMENTS

Figure 1C:
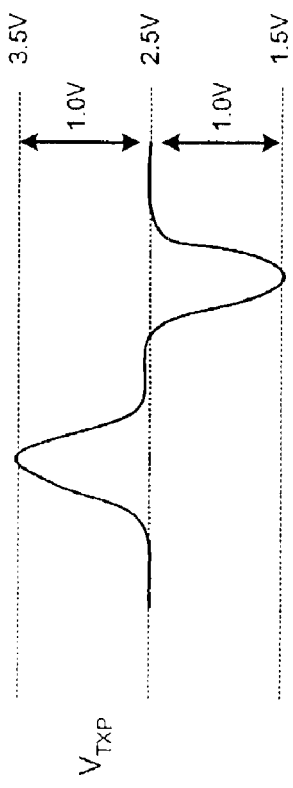
FIG. 1C illustrates an exemplary voltage output of the first and second circuits in FIGS. 1A and 1B that is switched by the switching circuit.
Figure 1A:
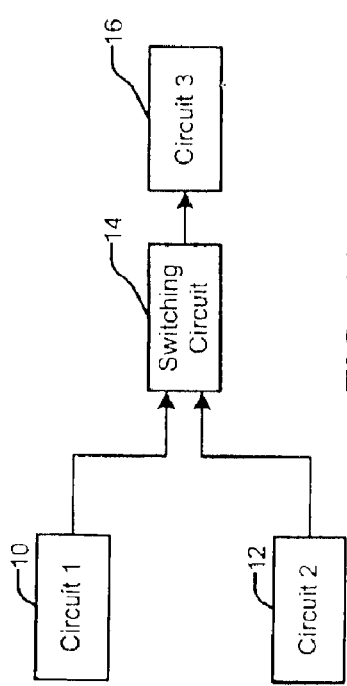
FIGS. 1A and 1B are functional block diagrams of a switching circuit according to the prior art.
Figure 1B:
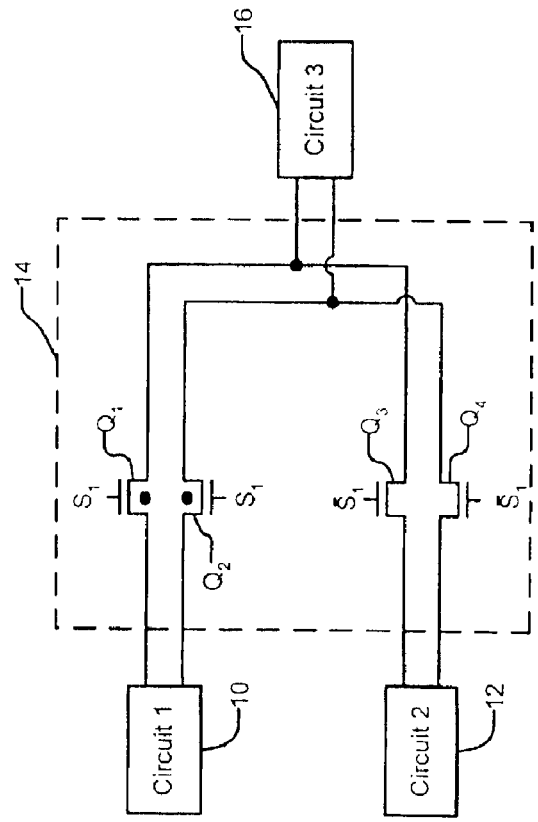

The following description of the preferred embodiment(s) is merely exemplary in nature and is in no way intended to limit the invention, its application, or uses. For purposes of clarity, the same reference numbers will be used in the drawings to identify similar elements.

Figure 3:
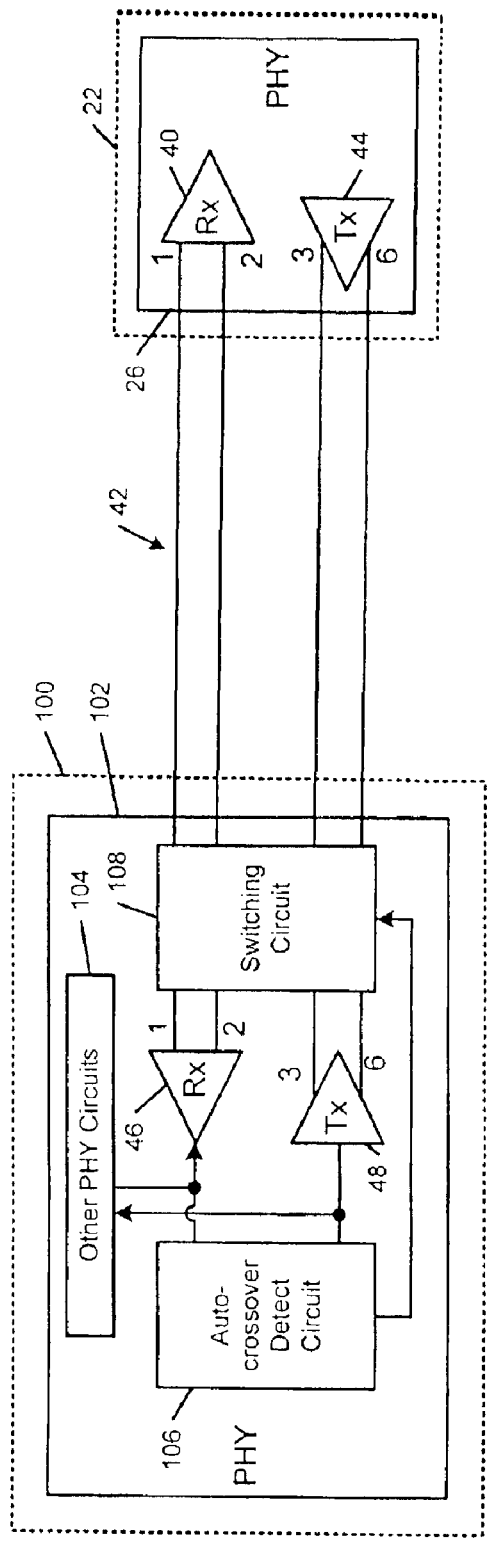
FIG. 3 illustrates a network device including an autocrossover circuit and a switching circuit according to the present invention.
Figure 4:
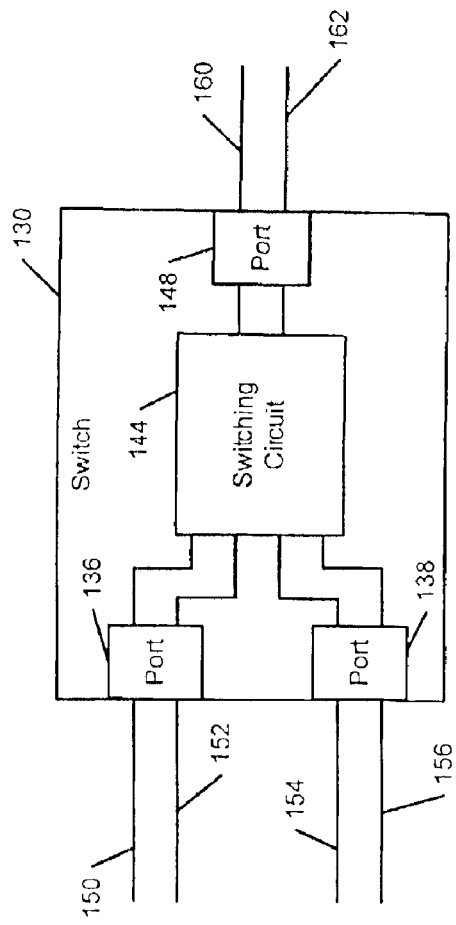
FIG. 4 is a functional block diagram of a multi-port switch including a switching circuit according to the present invention.

FIGS. 3, 4 and 5 illustrate several exemplary but not limiting uses of the analog switching circuit according to the present invention. Skilled artisans will appreciate that the analog switching circuit can be used in other environments than those depicted. FIGS. 6–10 illustrate the analog switching circuit in further detail.

Referring now to FIG. 3, a network device 100 includes a physical layer 102 with various physical layer circuits 104. An autocrossover circuit 106 communicates with the receiver 46, the transmitter 48, and an analog switching circuit 108 according to the present invention, which will be described more fully below. The autocrossover circuit 106 may also communicate with the physical layer circuits 104. The autocrossover circuit 106 automatically detects when the incorrect cable type is being used and generates a change configuration signal that is output to the analog switching circuit 108. Additional details relating to the autocrossover circuit 106 can be found in commonly assigned U.S. patent application Ser. No. 10/106,720, filed Mar. 26, 2002, which is hereby incorporated by reference in its entirety.

Referring now to FIG. 4, a functional block diagram of a multi-port switch 130 includes first and second ports 136 and 138. The ports 136 and 138 are selectively coupled by an analog switching circuit 144 according to the present invention to a third port 148. Each port 136, 138 and 148 includes first and second conductors 150 and 152, 154 and 156 and 160 and 162, respectively. The analog switching circuit 144 selectively switches the conductors 150 and 152 or 154 and 156 to the conductors 160 and 162.

Figure 5A:
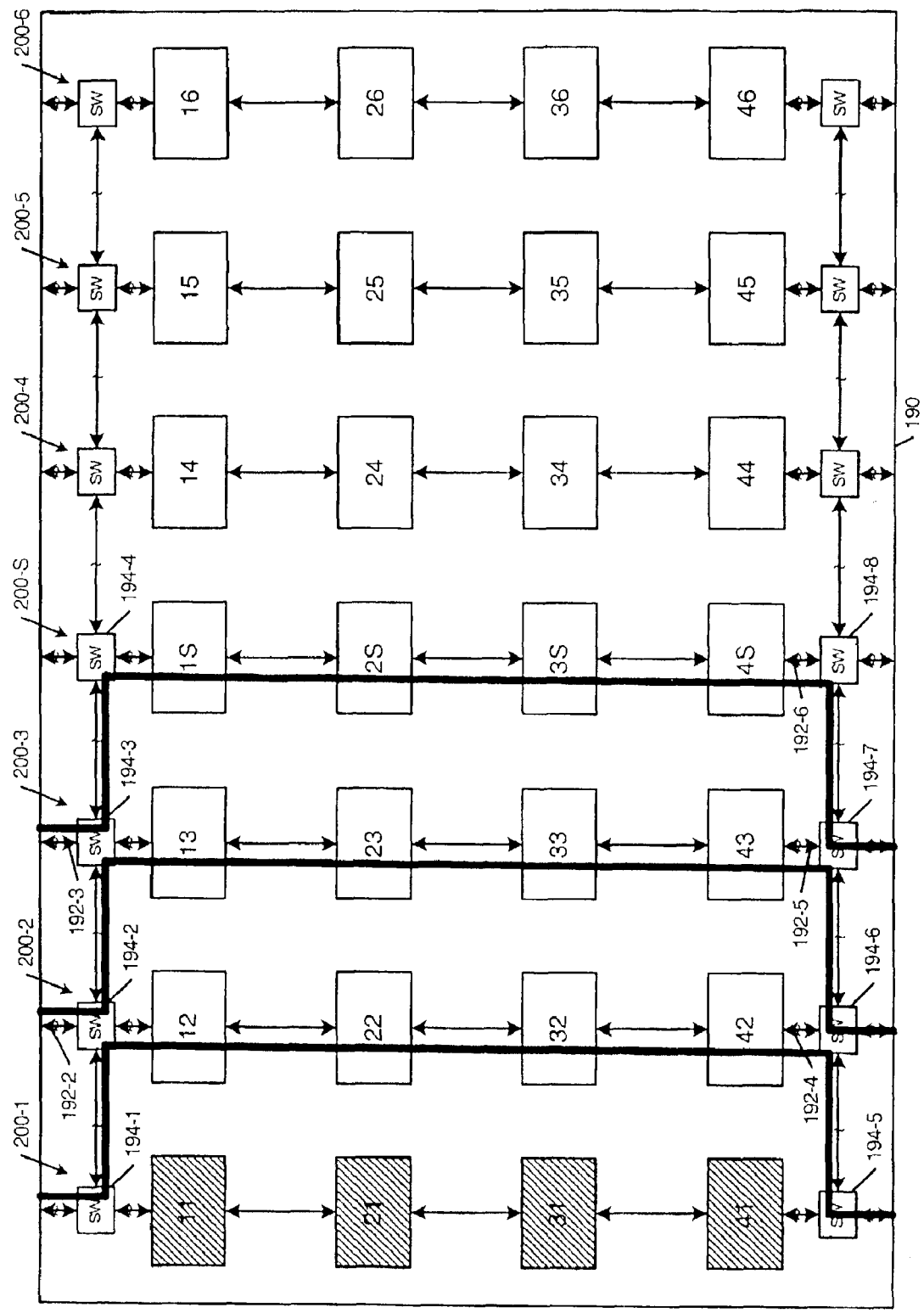
FIGS. 5A and 5B are functional block diagrams of a self-repairing semiconductor including a switching circuit according to the present invention.
Figure 5B:
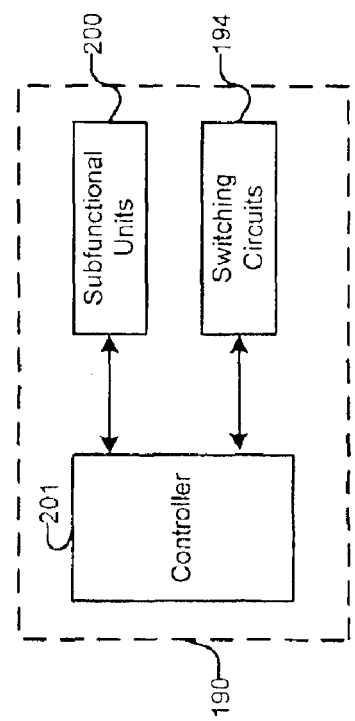

Referring now to FIGS. 5A and 5B, a self-reparable semiconductor 190 includes M generally independent functional units 200-1, 200-2, . . . , and 200-M (collectively referred to as functional units 200) that perform the same high level function. Self-reparable semiconductors are shown in commonly assigned U.S. patent application Ser. No. 10/358,709, filed Feb. 5, 2003, which is hereby incorporated by reference in its entirety. Each functional unit 200 includes the same N sub-functional units. In this example, N=4 and M=5. For example, the functional unit 200-1 includes sub-functional units 11, 21, 31, . . . , and 41. The functional unit 200-2 includes sub-functional units 12, 22, 32, . . . , and 42. The functional unit 200-6 includes sub-functional units 16, 26, 36, . . . , and 46.

The sub-functional units in a row perform the same lower level function. Typically, there are no connections between the functional units other than ground and power. There are, however, connections between the sub-functional units in a functional unit. The connections may be one-way or two-way and may include one or more connecting wires.

For example, four or eight Gigabit physical layer devices may be fabricated on the semiconductor. The physical layer device includes a first sub-functional unit that performs physical coding sub-layer (PCS), Flow Control Token (FCT), and Decision Feedback Sequence Estimation (DFSE) functions. A second sub-functional unit implements a finite impulse response (FIR) filter function. A third sub-functional unit performs echo and near end crosstalk (NEXT) functions. Fourth and fifth sub-functional units implement digital and analog front end (AFE) functions, respectively. As can be appreciated, the functional units can be separated into other sub-functional units. If the yield for each individual functional unit is 90%, then the yield for the semiconductor with x identical functional units is $(0.9)^x$. For example, if a semiconductor includes eight functional units each having a yield of 90%, the yield of the semiconductor is 43%, which is not an acceptable yield.

Referring again to FIG. 5A, a spare functional unit 200-S is fabricated on a semiconductor 190 in addition to the functional units 200-1, 200-2, . . . , and 200-6. In addition, switching circuits 194 according to the present invention are located at inputs and outputs of one of more of the sub-functional units. In the exemplary embodiment illustrated in FIG. 5A, the spare functional unit 200-S is located between the functional units 200. As can be appreciated, however, the spare functional unit 200-S can be located in any position on the semiconductor 190. For example, the spare functional unit 200-S can be located to the left or right of any of the functional units 200.

The switching circuits 194 and the spare functional unit 200-S allow the semiconductor 190 to replace one non-operable functional unit 200-1, 200-2, 200-3, 200-4, 200-5 or 200-6. In the example in FIG. 5A, the spare functional unit 200-S allows any number of sub-functional units in one functional unit to fail. By allowing the replacement of non-operable functional units, the yield of the semiconductor 190 is significantly improved. If one or any combination of the sub-functional units 11, 21, 31, and/or 41 in the functional unit 200-1 fail (as shown by cross-hatched shading), the analog switching circuits 194 are reconfigured to replace the non-operable sub-functional units 11, 21, 31, and 41 with the sub-functional units in the spare functional unit 200-S. In FIG. 5B, a controller 201 communicates with the functional units 200 and the switching circuits 194. The controller 201 may perform diagnostics to identify when a functional unit is not operating correctly. The controller 201 replaces the identified functional unit using the switching circuits 194.

For example, if the sub-functional unit 11 is non-operable, the inputs 192-1, 192-2, and 192-3 to the sub-functional units 11, 12, and 13 are shifted one functional unit to the right by switches 94-1, 94-2, 94-3, and 94-4. The outputs 92-4, 92-5, and 92-6 of the sub-functional units 42, 43, and 4S are shifted one functional unit to the left by switches 94-5, 94-6, 94-7, and 94-8.

After reconfiguration, the first functional unit 200-1 includes sub-functional units 12, 22, 32, and 42. The second functional unit 200-2 includes sub-functional units 13, 23, 33, and 43. The third functional unit 200-3 includes sub-functional units 1S, 2S, 3S, and 4S. The fourth functional unit 200-4 includes sub-functional units 14, 24, 34, and 44. The fifth functional unit 200-5 includes sub-functional units 15, 25, 35, and 45. The sixth functional unit 200-6 includes sub-functional units 16, 26, 36, and 46. This exemplary embodiment allows replacement on a functional unit basis only. However, additional switches can be used between sub-functional units to switch out one or more individual sub-functional units as described more fully in commonly assigned U.S. patent application Ser. No. 10/358,709, filed Feb. 5, 2003.

Figure 6:
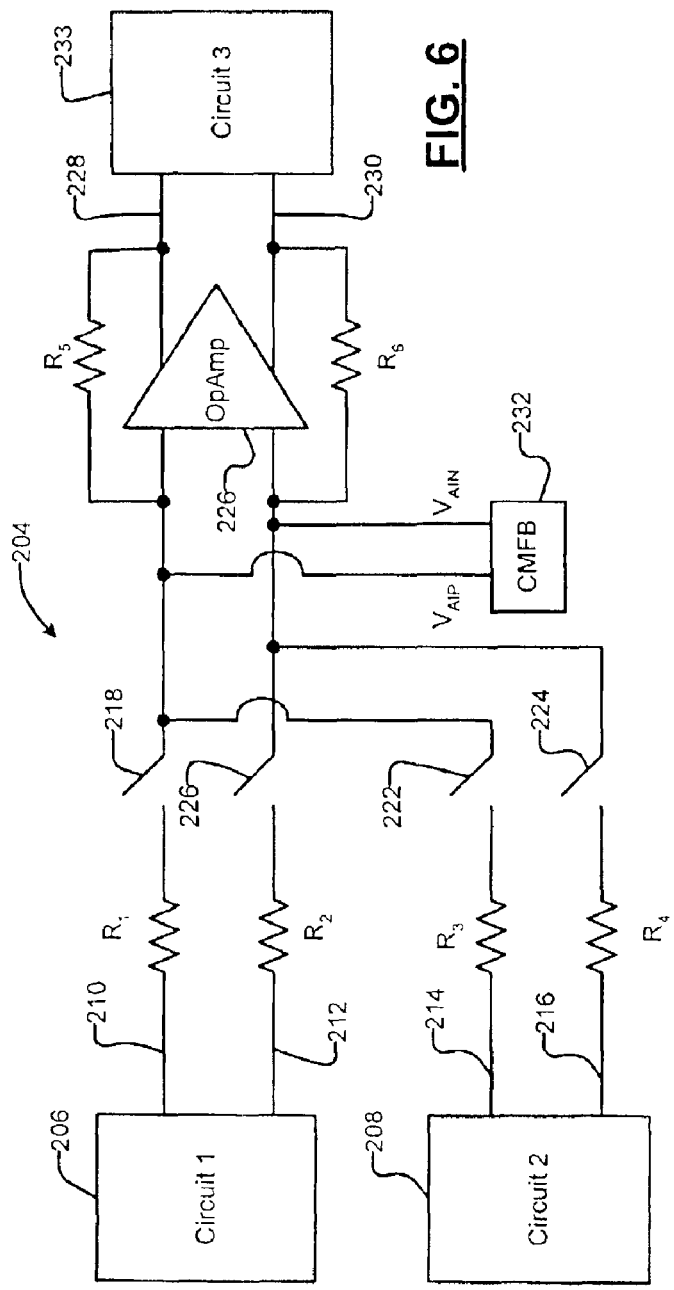
FIG. 6 is an electrical schematic and functional block diagram of an exemplary switching circuit according to the present invention.

Referring now to FIG. 6, an electrical schematic of an exemplary analog switching circuit 204 according to the present invention is shown. A first and second pair differential signals 210, 212 and 214, 216 are output by first and second circuits 206 and 208, respectively, to one end of resistors $R_1$, $R_2$, $R_3$ and $R_4$. The first and second differential signals have first and second common mode voltages, and maximum and minimum voltages. Opposite ends of the resistors $R_1$, $R_2$, $R_3$ and $R_4$ are connected to switches 218, 220, 222, and 224. The switches 218, 220, 222, and 224 selectively output either the first pair of signals 210, 212 or the second pair of input signals 214, 216 to inputs of an operational amplifier 226. The operational amplifier 226 includes feedback resistors $R_5$ and $R_6$, which are connected between inputs and outputs of the operational amplifier 226.

The operational amplifier 226 outputs a pair of output signals 228, 230 to a third circuit 233. When switches 218 and 220 are closed, switches 222 and 224 are open and the first pair of input signals 210, 212 is output to the operational amplifier 226. When switches 218 and 220 are open, switches 222 and 224 are closed and the second pair of input signals 214, 216 is output to the operational amplifier 226. A common mode feedback (CMFB) circuit 232 is connected to the inputs of the operational amplifier 226 to maintain a substantially fixed common mode voltage input that is lower than the first and second common mode voltages.

Referring now to FIG. 7, one exemplary implementation of the CMFB circuit 232 for the switching circuit 194 is shown. Referring back to FIG. 1C, an example of the input signals 210, 212 and 214, 216 is shown. The voltage level of the input signals may vary, or "swing," as high as 3.5 volts or as low as 1.5 volts and have a common mode voltage of 2.5V. The supply voltage of the transistors in the switching circuit 14 may only be around 2.5 volts or less. If the voltage level swings as high as 3.5 volts, the voltage level may exceed the breakdown voltage of the transistors in the switching device 14 and cause breakdown or other problems.

As shown in FIG. 7, voltage signals 234, 236 ($V_{AIP}$, $V_{AIN}$) and a constant common mode voltage 238 are input to an amplifier 240. The amplifier outputs adjust first and second controllable current sources 242 and 244. The current outputs of the current sources 242 and 244 adjust the voltage signals $V_{AIP}$ and $V_{AIN}$ to maintain the common mode voltage of the operational amplifier 226. The common mode voltage is limited to a common mode voltage that is less than the first and second common mode voltages. In the example set forth above, the common mode voltage of the operational amplifier is limited to 1.5V.

Figure 8:
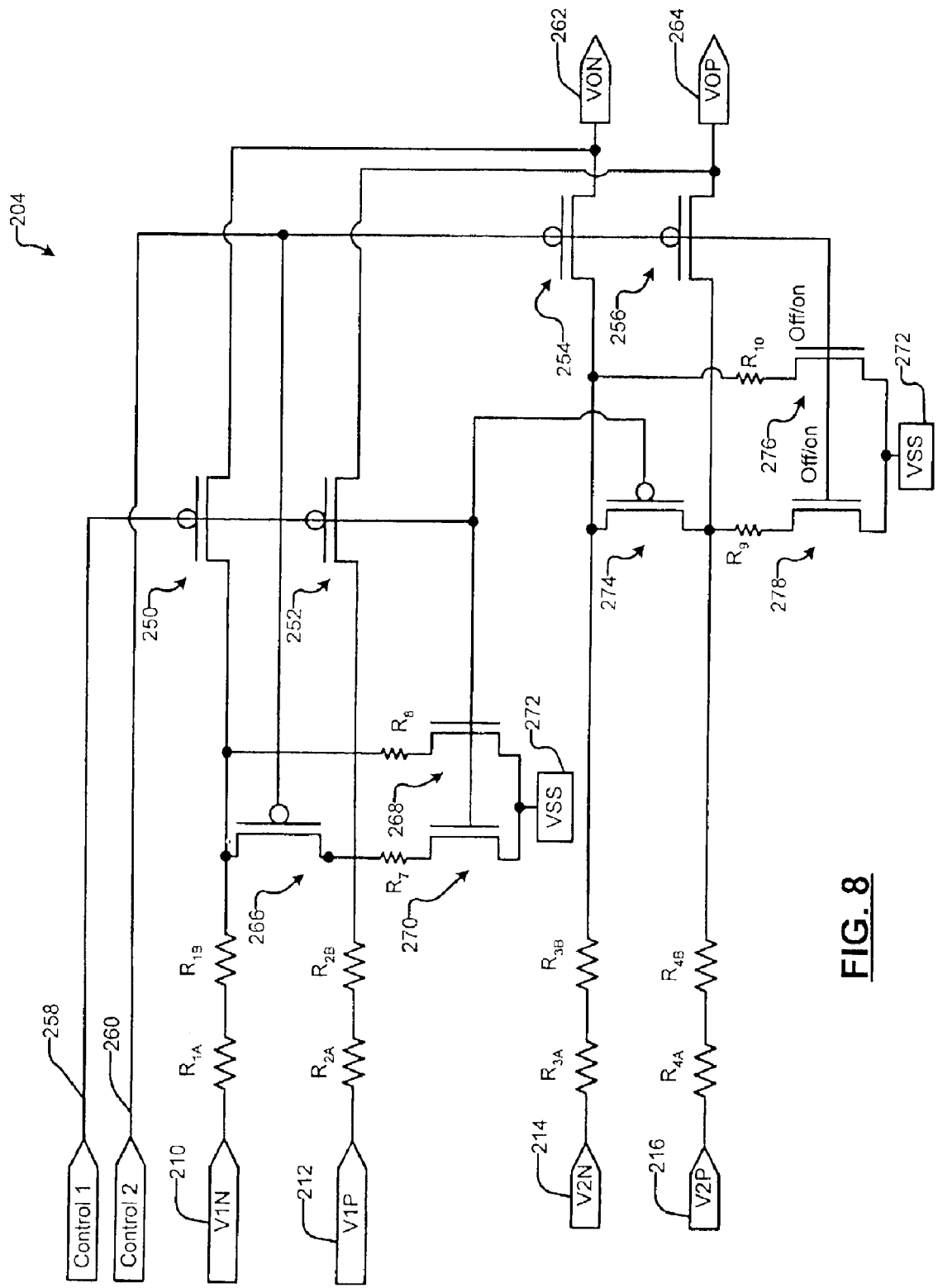
FIG. 8 is an electrical schematic of one exemplary implementation of the switching circuit according to the present invention.

Referring now to FIG. 8, an electrical schematic of one exemplary implementation of the analog switching circuit 204 according to the present invention is shown. The first pair of input signals 210, 212 is output via resistors $R_{1A}$ and $R_{1B}$ and $R_{2A}$ and $R_{2B}$ to a first pair of transistors 250, 252, respectively. The second pair of input signals 214, 216 is output via resistors $R_{3A}$ and $R_{3B}$ and $R_{4A}$ and $R_{4B}$ to a second pair of transistors 254, 256, respectively. A pair of switching signals 258, 260 controls the states of the first and second pairs of transistors 250, 252 and 254, 256 (and other transistors described below). In the preferred embodiment, the transistors 250, 252 and 254, 256 are PMOS transistors. However, other suitable transistors, such as NMOS transistors, may also be used. If the transistors 250, 252 are on, the transistors 254, 256 are off. Either the first pair of input signals 210, 212 or the second pair of input signals 224, 226 are output as output signals.

A transistor 266 and transistors 268 and 270 short the inputs 210 and 212 and bias the inputs 210 and 212 via resistors $R_7$ and $R_8$ to $V_{ss}$, respectively, to prevent drift, distortion and/or diode turn on. Transistors 274, 276 an 278 and resistors $R_9$ and $R_{10}$ perform a similar function for inputs 214 and 216.

Figure 9:
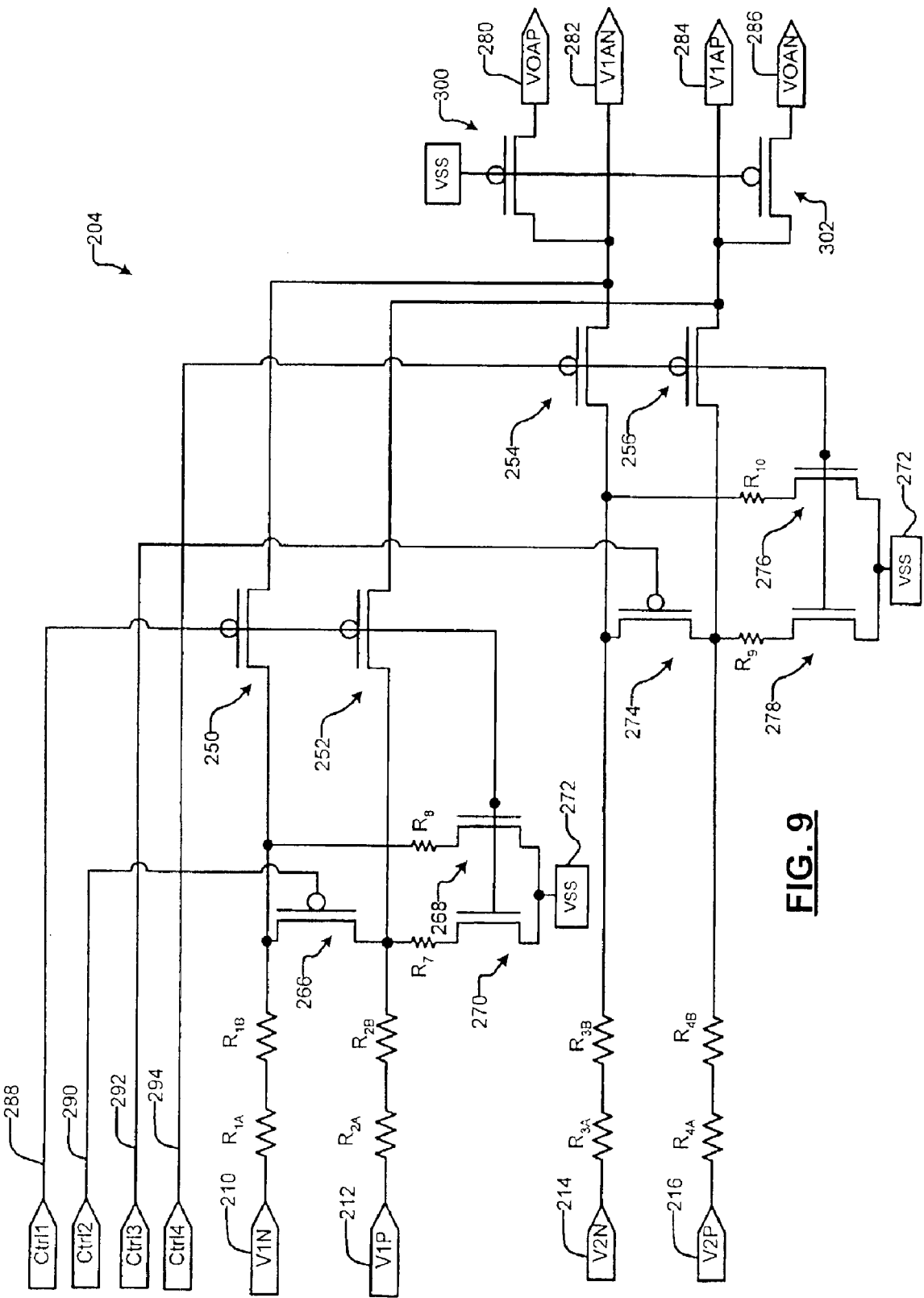
FIG. 9 is an electrical schematic of another exemplary implementation of the switching circuit according to the present invention.

Referring now to FIG. 9, an electrical schematic of another exemplary implementation of the switching circuit according to the present invention is shown. The switching circuit in FIG. 9 is similar to FIG. 8. However, additional switches 300 and 302 are added to eliminate the gain error caused by switching resistance, as will be described below.

Referring now to FIGS. 10 and 11, gain error that is introduced by the switching resistance for the circuits in FIGS. 8 and 9 is illustrated. In FIG. 10, the gain is defined as follows:

$$A(\text{gain}) = -\frac{R_2}{R_1 + R_s} \text{ if}$$

$$R_s = 0.1\ R_1, \text{ then}$$

$$A = -\frac{R_2}{1.1 R_1} = -0.909 \frac{R_2}{R_1}$$

Where $R_s$ is the switching resistance. This gain error may be acceptable when used in some receivers, such as 10BASET and 100BASE-T receivers. However, this gain error may not be acceptable in other implementations such as Gigabit or 802.3 ab compliant receivers.

In FIG. 11, the additional switches are added eliminate the gain error. The gain is defined as follows:

$$A = -\frac{R_2 + R_s}{R_1 + R_s} \text{ if}$$

$$R_s = 0.1\ R_1, \text{ and } R_2 = R_1, \text{ then}$$

$$A = -\frac{1.1 R_2}{1.1 R_1} = -\frac{R_2}{R_1}$$

Therefore, the additional switches 300 and 302 eliminate the gain error.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An analog switching circuit that selects one of a first pair of differential outputs of a first circuit having a first common mode voltage and a second pair of differential outputs of a second circuit having a second common mode voltage, wherein said analog switching circuit comprises:
   first and second switches having first ends that communicate with the first pair of differential outputs;
   third and fourth switches having first ends that communicate with the second pair of differential outputs;
   an operational amplifier having a first input that communicates with second ends of said first and third switches and a second input that communicates with second ends of said second and fourth switches; and
   a common mode feedback circuit that communicates with said first and second inputs of said operational amplifier and that maintains a common mode voltage input of said operational amplifier below the first and second common mode voltages.

2. The analog switching circuit of claim 1 wherein said first and third switches include first and second transistors, respectively, said first ends are one of drains and sources of said first and second transistors and said second ends are the other of said drains and sources.

3. The analog switching circuit of claim 1 further comprising:
   a first pair of resistors that are arranged between the first circuit and said first and second switches; and
   a second pair of resistors that are arranged between the second circuit and said third and fourth switches.

4. The analog switching circuit of claim 1 further comprising:
   a first resistance element having a first end that communicates with said first input of said operational amplifier and a second end that communicates with a first output of said operational amplifier; and
   a second resistance element having a first end that communicates with said second input of said operational amplifier and a second end that communicates with a second output of said operational amplifier.

5. The analog switching circuit of claim 1 wherein said common mode feedback circuit includes:
   an amplifier that includes a common mode input, a first input that communicates with said first input of said operational amplifier, a second input that communicates with said second input of said operational amplifier, and first and second outputs;
   a first current source that communicates with said first input of said operational amplifier and said first output of said amplifier, wherein a first current that is output by said first current source is adjusted by said first output of said amplifier; and
   a second current source that communicates with said second input of said operational amplifier and said second output of said amplifier, wherein a second current that is output by said second current source is adjusted by said second output of said amplifier.

6. The analog switching circuit of claim 1 further comprising:
   a fifth switch that selectively shorts the first pair of differential outputs of the first circuit; and
   a sixth switch that selectively shorts the second pair of differential outputs of the second circuit.

7. The analog switching circuit of claim 1 wherein the analog switching circuit is implemented in a network device with an autocrossover circuit, the first circuit is a transmitter, and the second circuit is a receiver and wherein said analog switching circuit receives a configuration change signal from said autocrossover circuit.

8. The analog switching circuit of claim 1 wherein said analog switching circuit is implemented in a self reparable semiconductor.

9. The analog switching circuit of claim 1 wherein said analog switching circuit is implemented in a switching system that selects between first and second ports.

10. The analog switching circuit of claim 6 further comprising:
    a first bias circuit that biases the first pair of differential outputs when the first pair of differential outputs are shorted; and
    a second bias circuit that biases the second pair of differential outputs when the second pair of differential outputs are shorted.

11. The analog switching circuit of claim 1 further comprising:
    a fifth switch that is connected to said first input of said operational amplifier and said second ends of said first and third switches; and
    a sixth switch that is connected to said second input of said operational amplifier and said second ends of said second and fourth switches.

12. An analog switching circuit that selects a pair of differential outputs of one of n circuits having a common mode voltage, wherein said analog switching circuit comprises:
    n first switches having first ends that communicate with first ones of the pairs of the differential outputs of the n circuits;
    n second switches having first ends that communicate with second ones of the pairs of the differential outputs of the n circuits;
    an operational amplifier having a first input that communicates with second ends of said n first switches and a second input that communicates with second ends of said n second switches; and
    a common mode feedback circuit that communicates with said first and second inputs of said operational amplifier and that maintains a common mode voltage input of said operational amplifier below the common mode voltage; wherein n is an integer greater than 1.

13. The analog switching circuit of claim 12 wherein said n first switches include n first transistors, said first ends are one of drains and sources of said n first transistors and said second ends are the other of said drains and sources of said n first transistors, and wherein said n second switches include n second transistors, said first ends are one of drains and sources of said n second transistors and said second ends are the other of said drains and sources of said n second transistors.

14. The analog switching circuit of claim 12 further comprising 2n resistors that are arranged between the n circuits and said n first and second switches.

15. The analog switching circuit of claim 12 further comprising:
    a first resistance element having a first end that communicates with said first input of said operational amplifier and a second end that communicates with a first output of said operational amplifier; and
    a second resistance having a first end that communicates with said second input of said operational amplifier and a second end that communicates with a second output of said operational amplifier.

16. The analog switching circuit of claim 12 wherein said common mode feedback circuit includes:
   an amplifier that includes a common mode input, a first input that communicates with said first input of said operational amplifier, a second input that communicates with said second input of said operational amplifier, and first and second outputs;
   a first current source that communicates with said first input of said operational amplifier and said first output of said amplifier, wherein a first current that is output by said first current source is adjusted by said first output of said amplifier; and
   a second current source that communicates with said second input of said operational amplifier and said second output of said amplifier, wherein a second current that is output by said second current source is adjusted by said second output of said amplifier.

17. The analog switching circuit of claim 12 further comprising n third switches that selectively short n−1 non-selected pairs of the n pairs of the differential outputs.

18. The analog switching circuit of claim 12 wherein said analog switching circuit is implemented in a network device with an autocrosser circuit, a first of said n circuits is a transmitter, and a second of said n circuits is a receiver and wherein said analog switching circuit receives a configuration change signal from said autocrossover circuit.

19. The analog switching circuit of claim 12 wherein said analog switching circuit is implemented in a self reparable semiconductor.

20. The analog switching circuit of claim 12 wherein said analog switching circuit is implemented in a switching system that selects between n ports.

21. The analog switching circuit of claim 17 further comprising n bias circuits that selectively bias the n−1 non-selected pairs of differential outputs when the n−1 non-selected pairs of differential outputs are shorted.

22. The analog switching circuit of claim 12 further comprising:
   a third switch that is connected to said first input of said operational amplifier and said second ends of said n first switches; and
   a fourth switch that is connected to said second input of said operational amplifier and said second ends of said n second switches.

23. An analog switching circuit that selects one of a first pair of differential outputs of a first circuit having a first common mode voltage and a second pair of differential outputs of a second circuit having a second common mode voltage, wherein said analog switching circuit comprises:
   first and second switching means for switching and having first ends that communicate with the first pair of differential outputs;
   third and fourth switching means for switching and having first ends that communicate with the second pair of differential outputs;
   first amplifying means for amplifying and having a first input that communicates with second ends of said first and third switching means and a second input that communicates with second ends of said second and fourth switching means; and
   feedback means that communicates with said first and second inputs of said first amplifying means for maintaining a common mode voltage input of said first amplifying means below the first and second common mode voltages.

24. The analog switching circuit of claim 23 wherein said first and third switching means include first and second transistors, respectively, said first ends are one of drains and sources of said first and second transistors, and said second ends are the other of said drains and sources.

25. The analog switching circuit of claim 23 further comprising:
   a first pair of resistors that are arranged between the first circuit and said first and second switching means; and
   a second pair of resistors that are arranged between the second circuit and said third and fourth switching means.

26. The analog switching circuit of claim 23 further comprising:
   first resistance means for providing resistance and having a first end that communicates with said first input of said first amplifying means and a second end that communicates with a first output of said first amplifying means; and
   second resistance means for providing a resistance and having a first end that communicates with said second input of said first amplifying means and a second end that communicates with a second output of said first amplifying means.

27. The analog switching circuit of claim 23 wherein said common mode feedback circuit includes:
   second amplifying means for amplifying and that includes a common mode input, a first input that communicates with said first input of said first amplifying means, a second input that communicates with said second input of said first amplifying means, and first and second outputs;
   first current means for providing a first current and for communicating with said first input of said first amplifying means and said first output of said second amplifying means, wherein said first current that is output by said first current means is adjusted by said first output of said second amplifying means; and
   second current means for providing a second current and for communicating with said second input of said first amplifying means and said second output of said second amplifying means, wherein said second current that is output by said second current means is adjusted by said second output of said second amplifying means.

28. The analog switching circuit of claim 23 further comprising:
   fifth switching means for selectively shorting the first pair of differential outputs of the first circuit; and
   sixth switching means for selectively shorting the second pair of differential outputs of the second circuit.

29. The analog switching circuit of claim 23 wherein said analog switching circuit is implemented in a network device with an autocrossover circuit, the first circuit is a transmitter and the second circuit is a receiver and wherein said analog switching circuit receives a configuration change signal from said autocrossover circuit.

30. The analog switching circuit of claim 23 wherein said analog switching circuit is implemented in a self reparable semiconductor.

31. The analog switching circuit of claim 23 wherein said analog switching circuit is implemented in a switching system that selects between first and second ports.

32. The analog switching circuit of claim 28 further comprising:
   first bias means for biasing the first pair of differential outputs when the first pair of differential outputs are shorted; and second bias means for biasing the second pair of differential outputs when the second pair of differential outputs are shorted.

33. The analog switching circuit of claim 23 further comprising:
   first gain error reducing means that is connected to said first input of said amplifying means and said second ends of said first and third switching means for reducing gain error; and
   second gain error reducing means that is connected to said second input of said amplifying means and said second ends of said second and fourth switching means for reducing gain error.

34. An analog switching circuit that selects a pair of differential outputs of one of n circuits having a common mode voltage, wherein said analog switching circuit comprises:
   n first switching means having first ends that communicate with first ones of the pairs of the differential outputs of the n circuits;
   n second switching means having first ends that communicate with second ones of the pairs of the differential outputs of the n circuits;
   first amplifying means having a first input that communicates with second ends of said n first switching means and a second input that communicates with second ends of said n second switching means; and
   feedback means that communicates with said first and second inputs of said first amplifying means for maintaining a common mode voltage input of said first amplifying means below the common mode voltage;
   wherein n is an integer greater than 1.

35. The analog switching circuit of claim 34 wherein said n first switching means include n first transistors, said first ends are one of drains and sources of said n first transistors and said second ends are the other of said drains and sources of said n first transistors, and wherein said n second switching means include n second transistors, said first ends are one of drains and sources of said n second transistors and said second ends are the other of said drains and sources of said n second transistors.

36. The analog switching circuit of claim 34 further comprising 2n resistors that are arranged between the n circuits and said n first and second switching means.

37. The analog switching circuit of claim 34 further comprising:
   first resistance means for providing resistance and having a first end that communicates with said first input of said first amplifying means and a second end that communicates with a first output of said first amplifying means; and
   second resistance means for providing resistance and having a first end that communicates with said second input of said first amplifying means and a second end that communicates with a second output of said first amplifying means.

38. The analog switching circuit of claim 34 wherein said common mode feedback circuit includes:
   second amplifying means for amplifying and that includes a common mode input, a first input that communicates with said first input of said first amplifying means, a second input that communicates with said second input of said first amplifying means, and first and second outputs;
   first current means for providing a first current and that communicates with said first input of said first amplifying means and said first output of said second amplifying means, wherein said first current that is output by said first current means is adjusted by said first output of said second amplifying means; and
   second current means for providing a second current and that communicates with said second input of said first amplifying means and said second output of said second amplifying means, wherein said second current that is output by said second current means is adjusted by said second output of said second amplifying means.

39. The analog switching circuit of claim 34 further comprising n third switching means that selectively short n−1 non-selected pairs of the n pairs of differential outputs.

40. The analog switching circuit of claim 34 wherein said analog switching circuit is implemented in a network device with an autocrossover circuit, a first of said n circuits is a transmitter, and a second of said n circuits is a receiver and wherein said analog switching circuit receives a configuration change signal from said autocrossover circuit.

41. The analog switching circuit of claim 34 wherein said analog switching circuit is implemented in a self reparable semiconductor.

42. The analog switching circuit of claim 34 wherein said analog switching circuit is implemented in a switching system that selects between n ports.

43. The analog switching circuit of claim 39 further comprising n bias means for selectively biasing the n−1 non-selected pairs of differential outputs when the n−1 non selected pairs of differential outputs are shorted.

44. The analog switching circuit of claim 34 further comprising:
   third switching means that is connected to said first input of said amplifying means and said second ends of said n first switching means; and
   fourth switching means that is connected to said second input of said amplifying means and said second ends of said n second switching means.

45. A method for providing an analog switching circuit that selects one of a first pair of differential outputs of a first circuit having a first common mode voltage and a second pair of differential outputs of a second circuit having a second common mode voltage, comprising:
   selectively connecting said one of the first and second pairs of differential outputs to an operational amplifier; and
   maintaining a common mode voltage input of said operational amplifier below the first and second common mode voltages.

46. The method of claim 45 further comprising selectively shorting the other one of the first and second pairs of differential outputs of the first circuit.

47. The method of claim 45 wherein the analog switching circuit is implemented in a network device with an autocrossover circuit.

48. The method of claim 47 wherein the first circuit is a transmitter and the second circuit is a receiver and further comprising generating a configuration change signal using said autocrossover circuit of said network device.

49. The method of claim 45 wherein the analog switching circuit is implemented in a self reparable semiconductor.

50. The method of claim 45 wherein said analog switching circuit is implemented in a switching system that selects between first and second ports.

51. The method of claim 46 further comprising biasing the other one of the first and second pairs of differential outputs when the other one of the first and second pairs of differential outputs is shorted.

52. A method for providing an analog switching circuit that selects one pair of n pairs of differential outputs associated with n circuits having a common mode voltage, comprising:

selectively connected said one pair of differential outputs of the n circuits to an operational amplifier; and maintaining a common mode voltage input of said operational amplifier below the common mode voltage; wherein n is an integer greater than 1.

53. The method of claim 52 further comprising selectively shorting n−1 non-selected pairs of differential outputs of the n circuit.

54. The method of claim 52 wherein the analog switching circuit is implemented in a network device with an autocrossover circuit.

55. The method of claim 54 wherein a first one of said n circuits is a transmitter and a second one of said n circuits is a receiver and further comprising generating a configuration change signal using said autocrossover circuit of said network device.

56. The method of claim 52 wherein the analog switching circuit is implemented in a self reparable semiconductor.

57. The method of claim 52 wherein said analog switching circuit is implemented in a switching system that selects between n ports.

58. The method of claim 53 further comprising biasing the n−1 non selected pairs of differential outputs of said n circuits when said n−1 non-selected pairs of differential outputs is shorted.

* * * * *

UNITED STATES PATENT AND TRADEMARK OFFICE
CERTIFICATE OF CORRECTION

PATENT NO. : 6,900,686 B1  Page 1 of 1
APPLICATION NO. : 10/455668
DATED : May 31, 2005
INVENTOR(S) : Pierte Roo It is certified that error appears in the above-identified patent and that said Letters Patent is hereby corrected as shown below:

Column 6, Line 24:   Delete "an" and insert -- and --
Column 6, Line 50:   Insert -- to -- after "added"
Column 8, Line 66:   Insert -- element -- after "resistance"
Column 13, Line 12:  Delete "circuit" and insert -- circuits --

Signed and Sealed this

Third Day of October, 2006

JON W. DUDAS
*Director of the United States Patent and Trademark Office*